(12) United States Patent
Okunuki

(10) Patent No.: US 6,617,595 B1
(45) Date of Patent: Sep. 9, 2003

(54) MULTI-LENS TYPE ELECTROSTATIC LENS, ELECTRON BEAM EXPOSURE APPARATUS AND CHARGED BEAM APPLIED APPARATUS USING THE LENS, AND DEVICE MANUFACTURING METHOD USING THESE APPARATUSES

(75) Inventor: Masahiko Okunuki, Akiruno (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/688,223

(22) Filed: Oct. 16, 2000

(30) Foreign Application Priority Data

Oct. 18, 1999 (JP) ............................................. 11-295698

(51) Int. Cl.[7] ............................. G21K 7/00; G01N 23/00
(52) U.S. Cl. .................. 250/492.22; 250/306; 250/396; 250/398
(58) Field of Search ........................... 250/492.22, 396, 250/398, 306

(56) References Cited

U.S. PATENT DOCUMENTS

| | | |
|---|---|---|
| 4,904,895 A | 2/1990 | Tsukamoto et al. |
| 5,834,783 A | 11/1998 | Muraki et al. |
| 2001/0054690 A1 * | 12/2001 | Shimada et al. ............ 250/306 |

FOREIGN PATENT DOCUMENTS

JP  9-245708  9/1997

OTHER PUBLICATIONS

USPTO publication No: US 2001/0054690 A1 "Electron Optical System Array. . ." by Shimada et al. Pub. date: Dec. 27, 2002.*

K.Y. Lee et al., "High Aspect Ratio Aligned Multilayer Microstructure Fabrication", J. Vac. Sci. Technol. B 12(6), Nov./Dec. 1994, pp. 3425–3430.

* cited by examiner

Primary Examiner—John R. Lee
Assistant Examiner—Zia R. Hashmi
(74) Attorney, Agent, or Firm—Fitzpatrick, Cella, Harper & Scinto

(57) ABSTRACT

Each of a plurality of electrostatic lens has inner walls of a plurality of lens apertures, which are formed by an electrode laid out around each beam axis, and high-resistance portions which are bonded to the electrode and are laid out on two sides of the electrode in the beam axis direction, and a low-resistance portion which is bonded to the high-resistance portions on a side opposite to the electrode in the beam axis direction.

18 Claims, 12 Drawing Sheets

EXAMPLE OF TWO HIGH-RESISTANCE SUBSTRATE ELECTRODES

EXAMPLE OF FOUR HIGH-RESISTANCE SUBSTRATE ELECTRODES

BEAM DIAMETER a : 0.16μm, b : 0.14μm, c : 0.23μm

SINGLE LENS

MULTI-LENS

MULTI-LENS TYPE ELECTROSTATIC LENS, ELECTRON BEAM EXPOSURE APPARATUS AND CHARGED BEAM APPLIED APPARATUS USING THE LENS, AND DEVICE MANUFACTURING METHOD USING THESE APPARATUSES

FIELD OF THE INVENTION

The present invention relates to an electrostatic lens used for a charged beam such as an electron beam, ion beam, and the like, an electron beam lithography apparatus and charged beam applied apparatus using the lens, and a device manufacturing method using these apparatuses.

BACKGROUND OF THE INVENTION

In recent years, LSI patterns have been increasingly miniaturized, and in the DRAM field, device integration has progressed like 256M, 1G, and 4G DRAMs after development of 64M DRAMs. An exposure technique is a very important one of micropatterning techniques, and especially, an electron beam lithography technique can achieve micropatterning of 0.1 μm or less, and is expected as one of future exposure means.

A conventional electron beam lithography apparatus used adopts a single-beam lithography scheme such as a Gaussian beam scheme, variable shaped beam scheme, and the like. These lithography schemes are used in application fields of mask write, research and developments of ultra LSIs, and ASIC devices which are produced in small quantity.

Recently, the electron beam technique has been studied and developed, and a new multi-beam lithography method which can improve the write speed using a plurality of electron beams has been proposed and studied as a scheme for an electron beam lithography apparatus which can improve productivity and can be used in the manufacture of memory devices such as DRAMs and the like. In order to obtain a throughput of 30 to 40 wafers/hour required in the manufacture of semiconductor devices in this multi-beam rendering scheme, several hundred or more beams are required as multi-beams. Therefore, a technique for forming a multi-lens with high layout density by reducing the size of electron lenses is important.

FIG. 6A shows an example of a typical microlens (K. Y. Lee, S. A. Rishton, & T. H. P. Chang, "High aspect ratio aligned multi-layer microstructure fabrication, J. Vac. Sci. Technology B12(6), 1994, 3425) manufactured using a silicon semiconductor process. In this example, an electrostatic lens is formed by bonding electrode substrates 51 to 53 each having a lens aperture 9 and Pyrex glass plates 54 and 55 to an Si substrate by anodic oxidation bonding.

FIG. 6B shows an example of a multi-lens comprised of a plurality of electrostatic lenses fabricated using Si substrates 61 to 63 and Pyrex glass plates 64 and 65 prepared by the aforementioned method. Fabrication of these electrostatic lenses using a semiconductor process is considered as an effective method in terms of miniaturization, shape precision, and layout precision.

However, an electrostatic lens of this type suffers the following problem. That is, the conventional electrostatic lens shown in FIG. 6A uses insulators as spacers between electrodes, and has a shape with which the insulators around the lens are directly observed from a beam axis 11 where an electron beam passes. Therefore, since an electron beam is readily influenced by charge-up of the insulator side walls due to electrons and ions scattered into the lens aperture, the on-axis potential in the electrostatic lens becomes unstable, and results in beam position drift and deteriorated lens focusing characteristics. Furthermore, when a multi-lens is formed by decreasing the layout spacings of a plurality of electrostatic lenses, crosstalk of electric fields due to electrodes and wiring is produced.

As a conventional method of preventing charge-up of an electrostatic lens, a structure in which insulators 74 and 75 are not directly observed by bending electrodes 71 to 73, as shown in FIG. 7, is used. This method is effective for preventing not only charge-up of an electrostatic lens but also crosstalk, but it is difficult for that method to improve the degree of integration by miniaturizing a multi-lens due to the complicated electrode shape.

SUMMARY OF THE INVENTION

The present invention has been made in consideration of the conventional problems, and has as its object to provide a compact multi-lens type electrostatic lens which has high beam position stability and lens focusing characteristics, is free from any influence of crosstalk between lenses, and has a high degree of integration, an electron beam lithography apparatus and charged beam applied apparatus with high productivity using the lens, and a device manufacturing method using these apparatuses.

In order to achieve the above object, a first multi-lens type electrostatic lens of the present invention is characterized by comprising a lens electrode substrate which is formed by stacking at least two substrates each having a plurality of lens apertures, an inner wall of each of which is formed by a high-resistance portion along a beam axis of a beam emitted by a beam source, and which has an electrode bonded around the plurality of lens apertures between the substrates, and low-resistance portions which have apertures corresponding to the plurality of lens apertures and are bonded to two surfaces of the lens electrode substrate.

A second multi-lens type electrostatic lens is characterized in that, in the first multi-lens type electrostatic lens, the high-resistance portion is made up of high-resistance layers formed on inner walls of apertures formed in an insulating substrate, each of the low-resistance portions is formed by forming apertures corresponding to the lens apertures in a low-resistance substrate, and stacking the low-resistance substrate on the insulating substrate, and wiring for the electrode is formed via the insulating substrates stacked on the two sides of the electrode.

A third multi-lens type electrostatic lens is characterized in that, in the first or second multi-lens type electrostatic lens, a plurality of electrostatic lenses equivalent to the electrostatic lens are independently controlled.

A fourth multi-lens type electrostatic lens is characterized in that, in any one of the first to third multi-lens type electrostatic lenses, a plurality of electrostatic lenses equivalent to the electrostatic lens are laid out to form a face-centered structure.

A fifth multi-lens type electrostatic lens is characterized in that, in the second multi-lens type electrostatic lens, the low-resistance substrate is located on an outermost side to sandwich the insulating substrate, and a thickness T thereof and a diameter D of the aperture satisfy T>0.3D.

A sixth multi-lens type electrostatic lens is characterized in that, in any one of the first to fifth multi-lens type electrostatic lenses, a resistance of the high-resistance portion is not constant along a beam axis direction.

A seventh multi-lens type electrostatic lens is characterized in that, in any one of the first to sixth multi-lens type electrostatic lenses, a resistance of the high-resistance portion has a positive differential coefficient along the beam axis.

An eighth multi-lens type electrostatic lens is characterized in that, in any one of the first to seventh multi-lens type electrostatic lenses, a plurality of electrodes equivalent to the electrodes are present in a beam axis direction, and arbitrary potentials can be respectively applied to the plurality of electrodes.

A ninth multi-lens type electrostatic lens is characterized in that, in the eighth multi-lens type electrostatic lens, a differential coefficient of a gradient of a voltage applied to the plurality of electrodes present in the beam axis direction is positive in an acceleration lens system and is negative in a deceleration lens system along the beam axis.

A 10th multi-lens type electrostatic lens is characterized by further comprising temperature-controllable cooling means in any one of the first to ninth multi-lens type electrostatic lenses.

A 11th multi-lens type electrostatic lens is characterized in that, in any one of the first to 10th multi-lens type electrostatic lenses, a resistivity of the high-resistance portion falls within a range from $10^6$ Ωcm to $10^9$ Ωcm.

A 12th multi-lens type electrostatic lens is characterized in that, in any one of the first to 11th multi-lens type electrostatic lenses, the high-resistance portion consists of any one of silicon carbide, a nitrogen compound, and cladglass.

An electron beam lithography apparatus of the present invention is characterized by using any one of the first to 12th multi-lens type electrostatic lenses.

A charged beam applied apparatus of the present invention is characterized by using any one of the first to 12th multi-lens type electrostatic lenses.

A device manufacturing method of the present invention is characterized by comprising the step of applying a resist on a substrate, the step of directly writing a pattern on the substrate using an electron beam lithography apparatus or charged beam applied apparatus of the present invention, and the development step of developing the substrate, the electron beam lithography apparatus or charged beam applied apparatus comprising a lens electrode substrate which is formed by stacking at least two substrates each having a plurality of lens apertures, an inner wall of each of which is formed by a high-resistance portion along a beam axis of a beam emitted by an electron beam source, and which has an electrode bonded around the plurality of lens apertures between the substrates, and low-resistance portions which have apertures corresponding to the plurality of lens apertures and are bonded to two surfaces of the lens electrode substrate.

In these arrangements of the present invention, since the inner wall of the lens aperture is formed by an electrode and a high-resistance portion joined to the electrode, and a low-resistance portion joined to the high-resistance portion is provided on the side opposite to the electrode, even when a scattered beam strikes the inner wall, the charge is relieved via the high-resistance portion, thus preventing charge-up in the lens aperture by a simple arrangement. Also, crosstalk between electric fields of neighboring electrostatic lenses can be prevented by the shield effect of the high-resistance portion. Hence, the degree of integration of electrostatic lenses can be improved, and the productivity in the manufacture of devices can also be improved.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

An electrostatic multi-lens according to the present invention which has high charged beam position stability and lens focusing characteristics, and can minimize crosstalk between lenses, and its application method will be explained below.

(Basic Structure of Lens)

Figure 1:
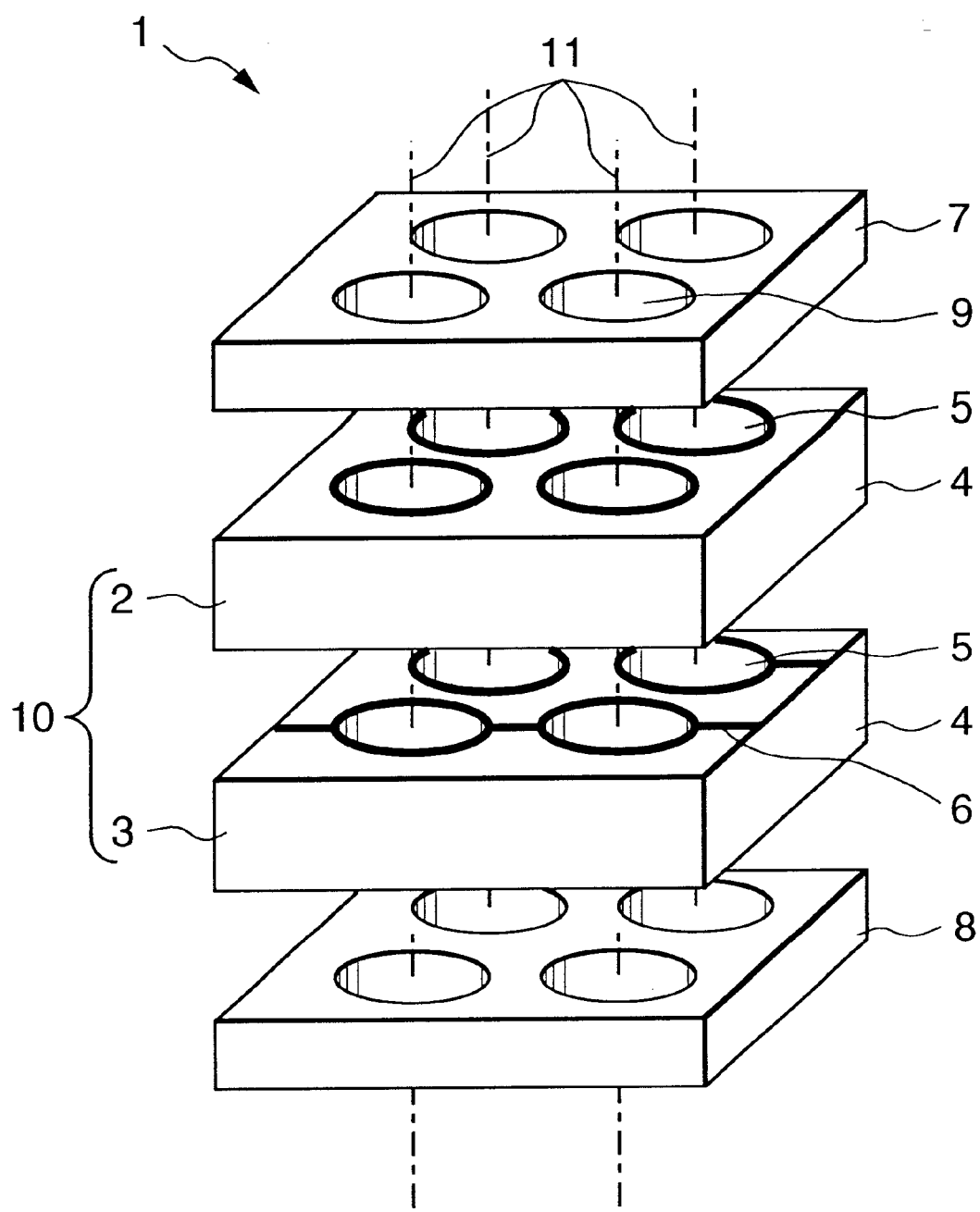
FIG. 1 is a view showing the structure of a resistor electrode lens according to the present invention.

FIG. 1 shows the lens electrode structure of a resistor electrode lens 1 as an electrostatic lens according to the present invention. This resistor electrode lens 1 is comprised of a lens electrode substrate 10 formed of two high-resistance electrode substrates 2 and 3, an upper electrode substrate 7, and a lower electrode substrate 8. Each electrode substrate is formed with lens apertures 9 at the positions of beam axes 11 where charged beams pass. On each of the high-resistance electrode substrates 2 and 3, the lens apertures 9 are formed on a substrate made up of an insulator 4, and their inner walls are covered by a high-resistance layer 5. The high-resistance layer 5 is electrically connected to a wiring electrode 6 formed on the substrate of the insulator 4. The high-resistance electrode substrates 2 and 3 are bonded to each other to form the lens electrode substrate 10. The upper and lower electrode substrates 7 and 8 each made up of a low-resistor are respectively bonded to the upper and lower surfaces of the substrate 10.

Figure 4A:
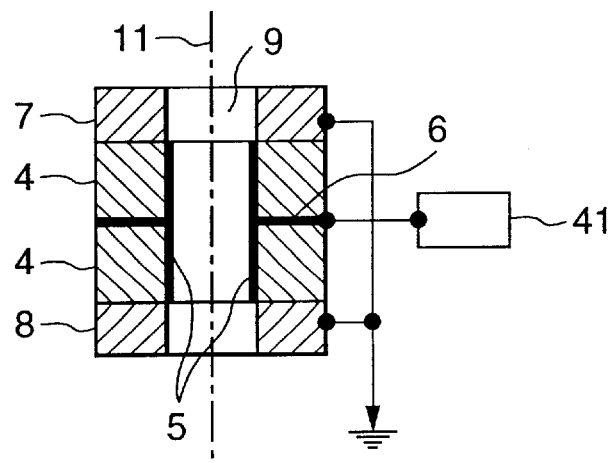
FIGS. 4A and 4B are views for explaining the operation of the resistor electrode lens.

FIG. 4A is a sectional view of one lens of the resistor electrode lens 1 shown in FIG. 1. The electric field intensity distribution in the lens aperture 9 is formed by the potential of the wiring electrode 6 given by a lens control power supply 41, and the potential of the high-resistance layer 5 generated between the upper electrode substrate 7 and the ground potential of the lower electrode substrate 8. As can be seen from FIG. 4A, since the beam axis 11 of a charged beam which passes through the lens is surrounded by the high- and low-resistors, even if a scattered beam strikes the side wall in the lens, the charge is relieved via the high-resistance layer 5, thus preventing charge-up in the lens. Hence, position instability of the charged beam and deteriorated lens focusing characteristics can be prevented.

Since the high-resistance layer 5 in each lens aperture of the resistor electrode lens 1 has an effect of shielding the influence of the electric fields of neighboring electrodes, it can prevent the influence of crosstalk of neighboring lens electric fields of the multi-lens.

Furthermore, as shown in FIG. 1, the upper and lower electrode substrates 7 and 8, each of which is made up of a low-resistor material, are provided to the upper and lower surfaces of the lens electrode substrate 10 so as to suppress the influence of crosstalk between neighboring lenses due to the electric field distribution which extends from each lens aperture 9 to outside the lens. If T represents the thickness of each of the upper and lower electrode substrates 7 and 8, and D represents the diameter of the lens aperture 9, crosstalk between neighboring lens apertures 9 can be prevented by setting $T \geq 0.3D$.

Figure 7:
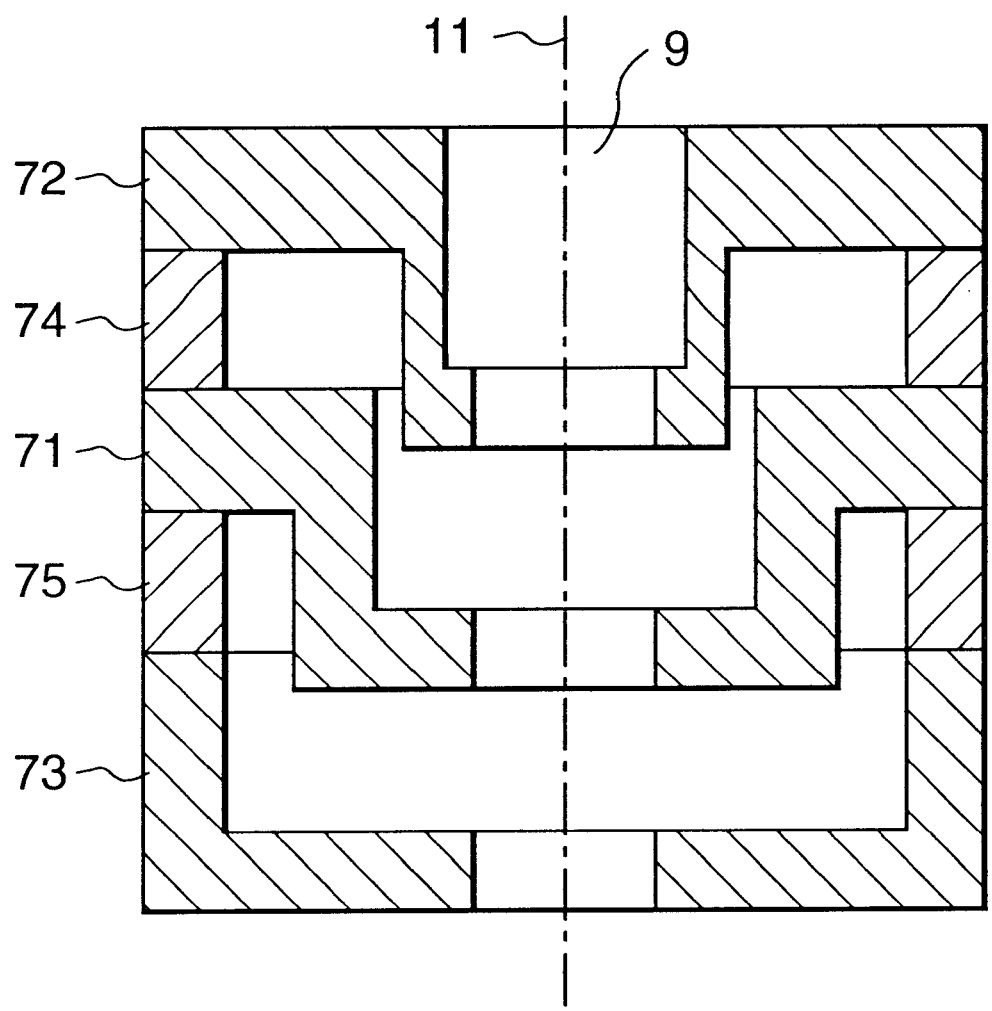
FIG. 7 is a sectional view showing the prior art of a multi electrostatic lens with a shield electrode.

A feature of the lens shape will be explained below. The structure of the resistor electrode lens 1 has a simple cylindrical shape, and can assure a broad effective area of the lens aperture 9 since it has no complicated shield electrode unlike in the prior art shown in FIG. 7. This means that not only the electric field distribution uniformity in the lens aperture 9 is improved to minimize lens aberrations of the electrostatic lens but also the mechanical required precision of the electrode shape can be relaxed.

Figure 2:
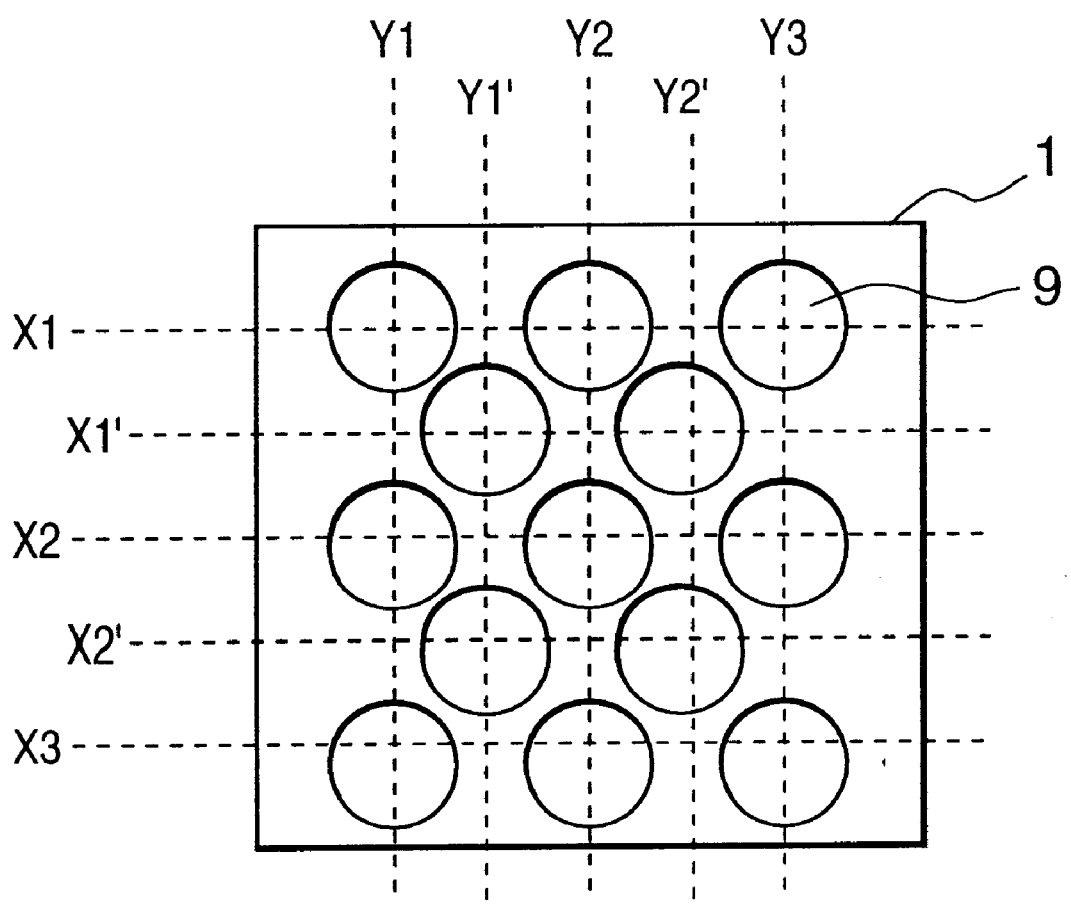
FIG. 2 shows the layout of electrostatic lenses in a resistor electrode lens with a dense structure layout according to the present invention.

FIG. 2 shows an example of the resistor electrode lens 1 having a higher lens layout density. In the conventional electrostatic lens, since the lens apertures cannot be formed at nearby positions due to the presence of shield electrodes, lenses are laid out at intersections between lines X1, X2, and X3, and Y1, Y2, and Y3 in FIG. 2. By contrast, since the resistor electrode lens 1 of the present invention has no shield electrode, electrostatic lenses can also be laid out at the intersections between lines X1' and X2', and Y1' and Y2'. This layout forms a face-centered structure, and can improve the layout density to twice or more that using the conventional electrostatic lenses.

(Optimization of On-axis Electric Field Distribution)

Another feature of the resistor electrode lens 1 lies in that the on-axis electric field distribution can be arbitrarily determined by changing the resistance of the high-resistance layer 5 in each lens aperture 9 along the direction of the beam axis, thus forming an electric field distribution suitable for the focusing characteristics of the electrostatic lens.

Figure 5:
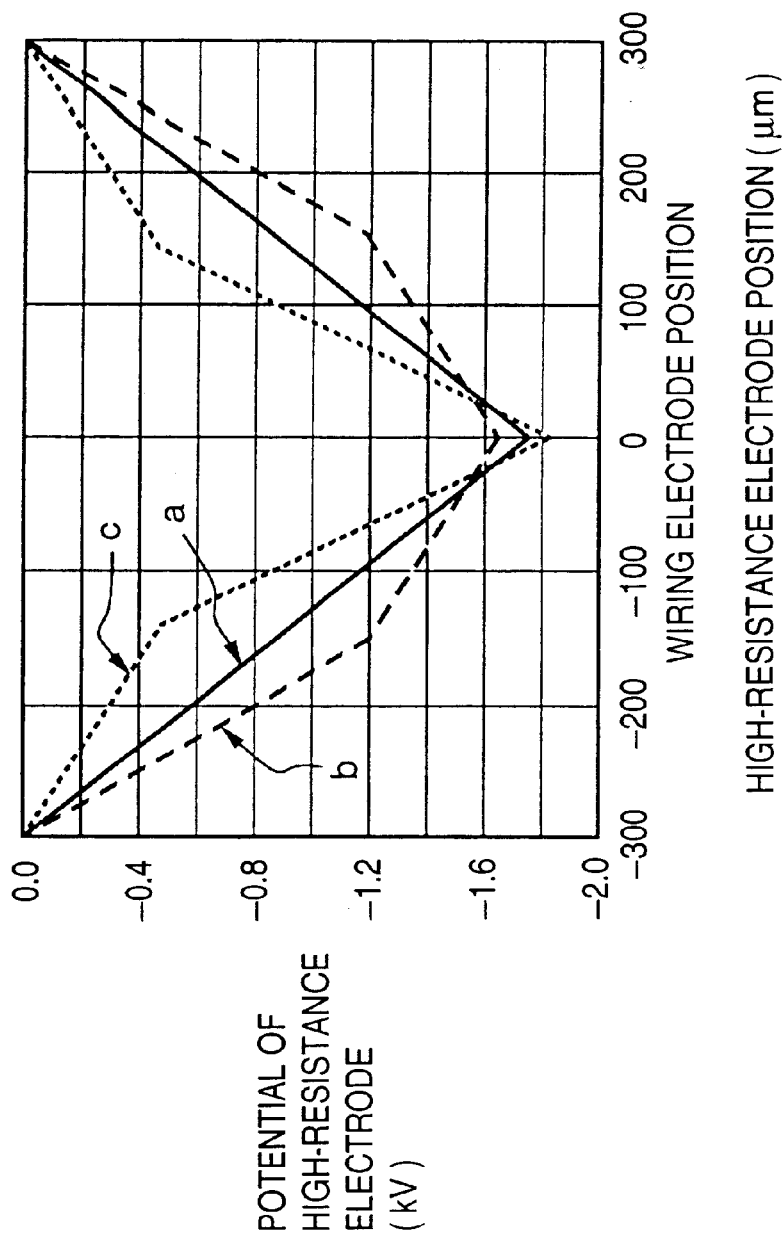
FIG. 5 is a graph showing the characteristics of a resistor electrode lens using a divided electrode according to the present invention.
Figure 6A:
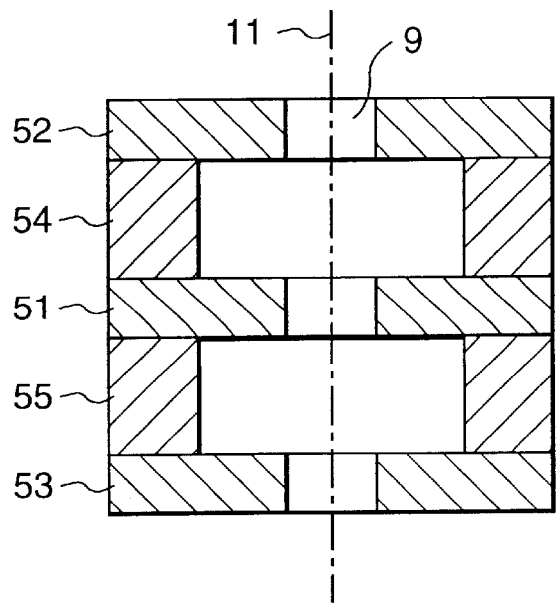
FIGS. 6A and 6B are sectional views showing the prior art of an electrostatic lens.
Figure 6B:
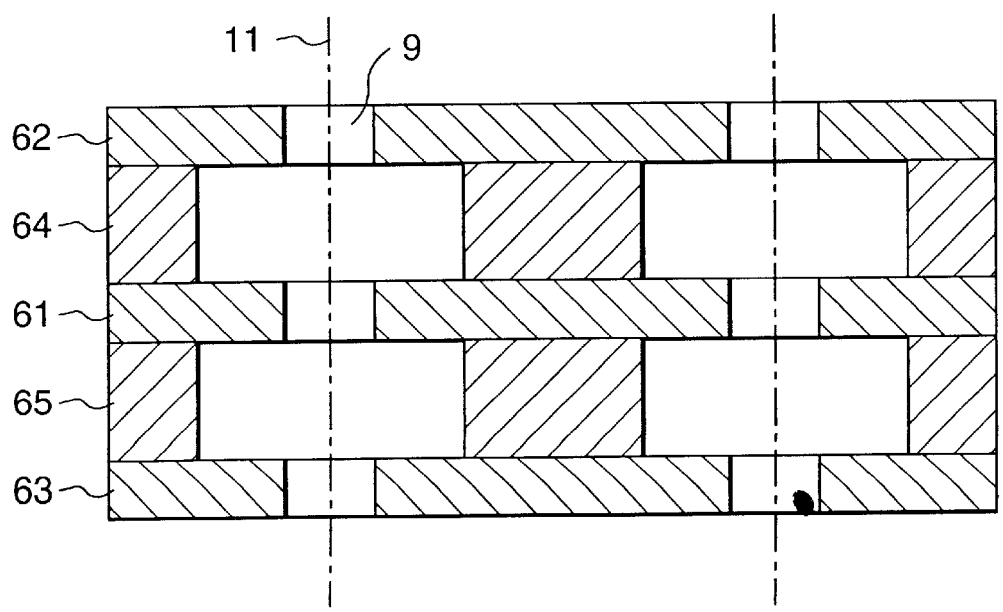

FIG. 5 shows the surface potential of the high-resistance layer 5 required for obtaining a given focal length when the resistance of the high-resistance layer 5 of the resistor electrode lens shown in FIG. 4A is changed. This example shows the characteristics when the diameter of the lens aperture 9 is 160 $\mu$m, the thickness of each of the high-resistance electrode substrates 2 and 3 is 300 $\mu$m, the substrate thickness of each of the upper and lower electrode substrates 7 and 8 is 100 $\mu$m, and the electrostatic lens forms a deceleration system. Lines a to c in FIG. 5 represent the positions and surface potentials of the high-resistance layer 5 corresponding to three different resistor distributions required for obtaining a focal length=1 m of an electron beam of 50 KeV. Line a represents a case wherein the high-resistance layer 5 has a constant resistance along the beam axis. Lines b and c represent cases wherein the high-resistance layer 5 has two different resistances along the beam axis. Line b represents a case wherein the resistance on the entrance and exit sides of the beam is nearly twice that on the wiring layer side of the lens center, and line c represents the case the resistance on the wiring layer side is nearly ½ that on the entrance and exit sides of the beam. The results of the beam focusing characteristics are 0.16 $\mu$m in case of line a, 0.14 $\mu$m in case of line b, and 0.23 $\mu$m in case of line c. In these cases, a lens electric field formed by the resistance distribution of line b exhibits an optimal value.

This results from a smooth on-axis potential gradient obtained by increasing the potential gradient on the entrance/exit side of the electrostatic lens, and lens aberrations, especially, spherical aberration can be improved. In this case, the high-resistance layer 5 has two different resistances along the beam axis. However, the layer 5 may have three or more different resistance values, or the resistance may change continuously to obtain the same effect. In general, when the high-resistance layer 5 is formed so that the resistance has a positive differential coefficient, the focusing characteristics of the electrostatic lens can be improved.

Figure 4B:
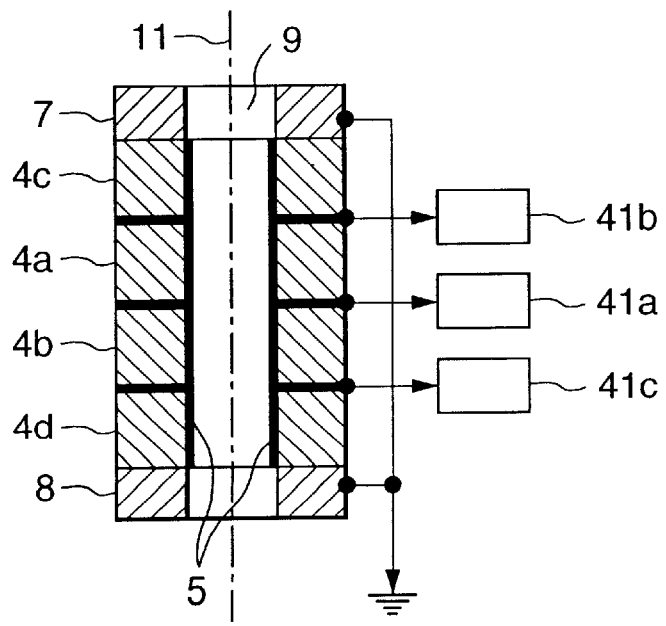

As another example of adjusting the on-axis electric field distribution, a method of using a larger number of high-resistance electrode substrates and applying voltages that match the lens characteristics to the wiring electrodes of these substrates is available. FIG. 4B shows an example in which four high-resistance electrode substrates 4a to 4d are used compared to the lens shown in FIG. 4A. In this example, by adjusting potentials applied to the wiring electrodes of these substrates by lens control power supplies 41a to 41c, the electric field distribution in the lens aperture 9 can be optimized.

(Temperature Control)

The resistor electrode lens 1 of the present invention forms an electric field in each lens aperture 9 by applying a voltage across the high-resistance layer 5, and always supplies a constant small current to the high-resistance layer 5 when it is used. Hence, by preventing temperature rise due to heating of the high-resistance layer 5 by cooling and temperature control of the lens, the resistor electrode lens 1 can stably operate.

Figure 3A:
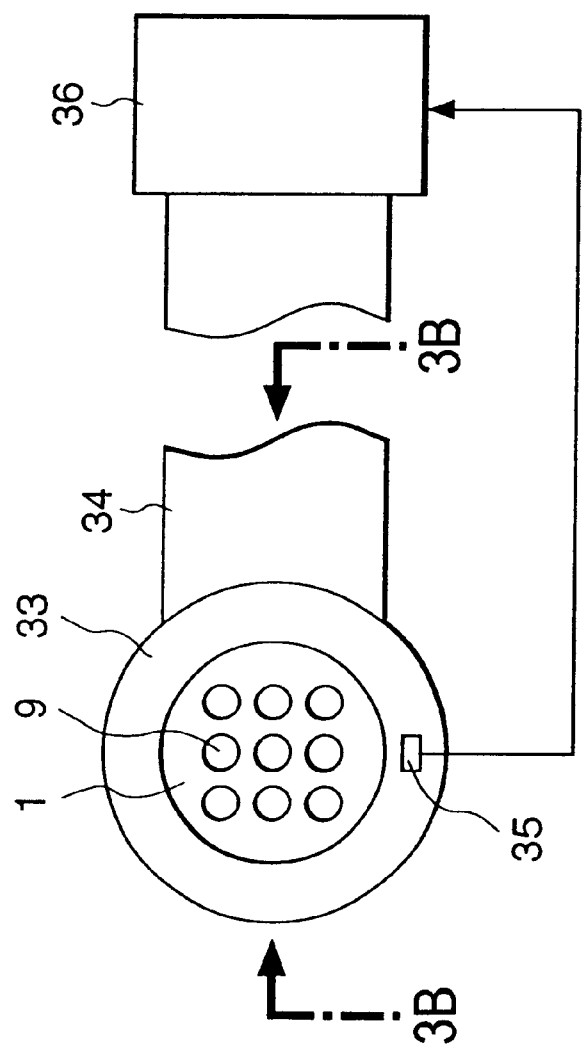
FIG. 3A is a view showing a cooling method of the resistor electrode lens according to the present invention.
Figure 3B:
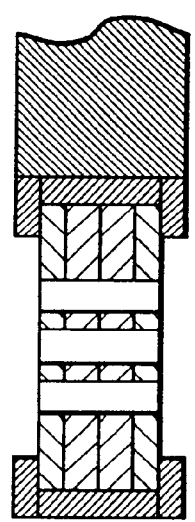
FIG. 3B is a sectional view taken along line A–A' in FIG. 3A according to the present invention.

FIG. 3A shows the cooling method of the resistor electrode lens 1, and FIG. 3B is a sectional view taken along line A–A' of FIG. 3A. The resistor electrode lens 1 comprises a cooling plate 33 that surrounds the lens 1, a cooling rod 34 one end of which is connected to the cooling plate 33, a temperature sensor 35 provided on the cooling plate 33, and a temperature control unit 36 to which the other end of the cooling rod 34 is connected, and can be maintained at a given temperature. Especially, the cooling plate 33 can bring the upper and lower electrode substrates with high heat conductivity into thermal contact with each other to increase temperature uniformity, thus improving cooling efficiency. The lens heating condition is determined by conditions such as the resistance of a high-resistance material used, the lens shape, the lens voltage, and the like. For example, when the high-resistance layer 5 used shown in FIG. 1 has a resistivity of $10^8$ $\Omega$cm, if the high-resistance. electrode substrate 2 has a thickness of 500 $\mu$m, the lens aperture 9 has a diameter of 100 μm, the high-resistance layer 5 has a film thickness of 0.2 μm, the number of lenses in the multi-lens is 5,000, and the voltage applied to the wiring electrode 6 is 1,000 V, a heat quantity of around 0.6 W is generated in the resistor electrode lens.

The lower limit of the resistance corresponds to a maximum heat generation quantity of 100 W of the multi-lens of this example, and a resistivity of around $10^6$ Ωcm or higher. The upper limit of the resistance must be a value that can avoid charge-up of the surface of the high-resistance layer 5 due to a scattered beam or the like, and does not influence the lens characteristics of a charged beam that passes through the lens, and a high-resistance material having a resistance of around $10^9$ Ωcm or less can be used.

(Composition Material)

As materials that form the high-resistance electrode substrate 2 in FIG. 1, various ceramics (AiN, SiC, $Al_2O_3$, BeO) or glass materials as insulators can be used. The high-resistance layer 5 can be formed as a high-resistance film with high uniformity having a thickness of 20 nm to 1,000 nm by depositing a material containing silicon carbide, nitrogen compound, or the like by sputtering.

As another method of forming the high-resistance layer 5, a method using cladglass used as a channel plate material is known. With this material, the layer 5 can be formed by controlling the resistance of the inner wall of the lens aperture 9 corresponding to a channel by heating it in a hydrogen-containing atmosphere to precipitate reduced metal lead.

As a material of the wiring electrode 6, a transition metal such as W, Ta, or the like, Si or silicide-based material, or the like can be used.

As a material of the upper and lower electrode substrates 7 and 8, a low-resistor material is used, and a metal substrate or an impurity-doped Si substrate may be used.

(Applied Apparatus)

Figure 8:
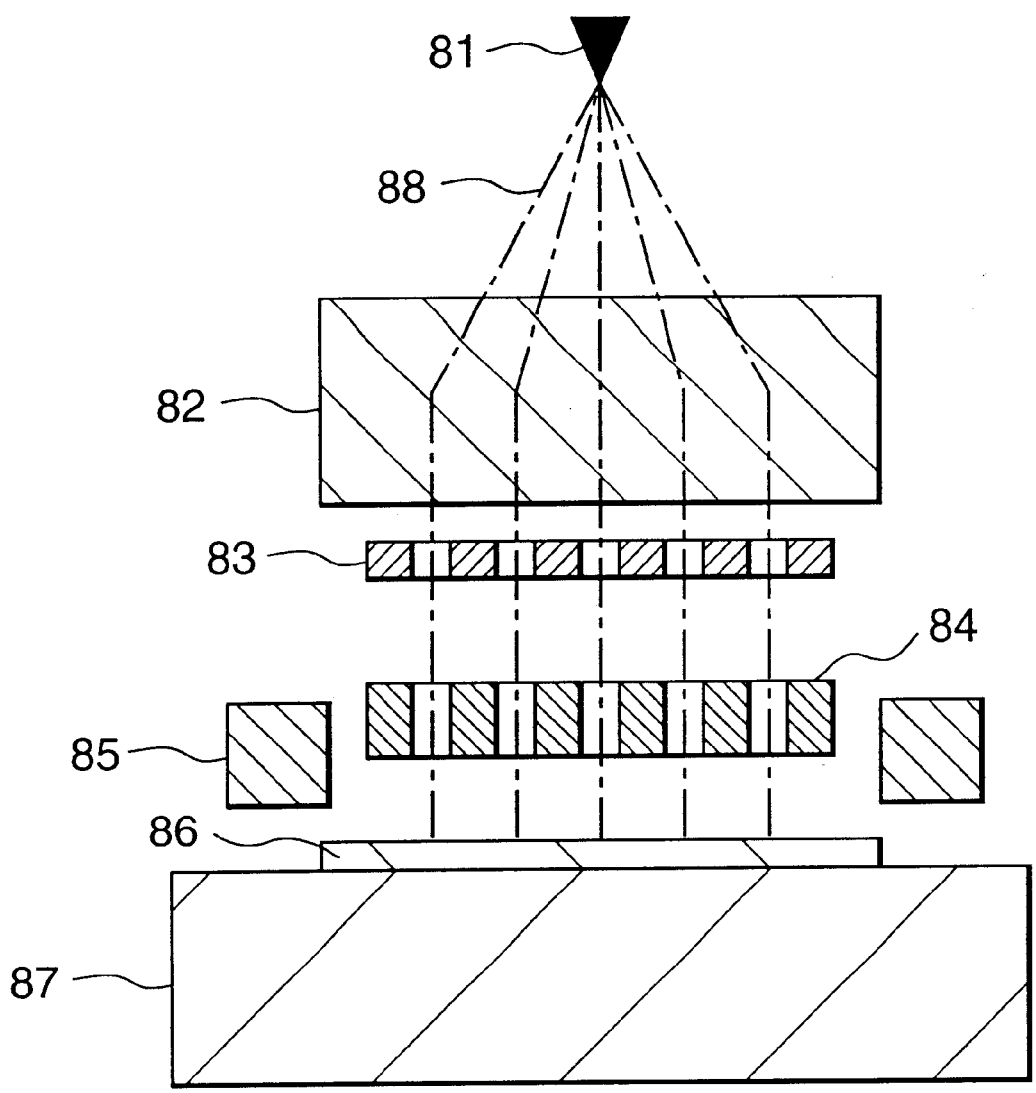
FIG. 8 is a sectional view showing an example of a multi-beam scheme using one electron source as an application example of the multi-beam scheme.
Figure 9:
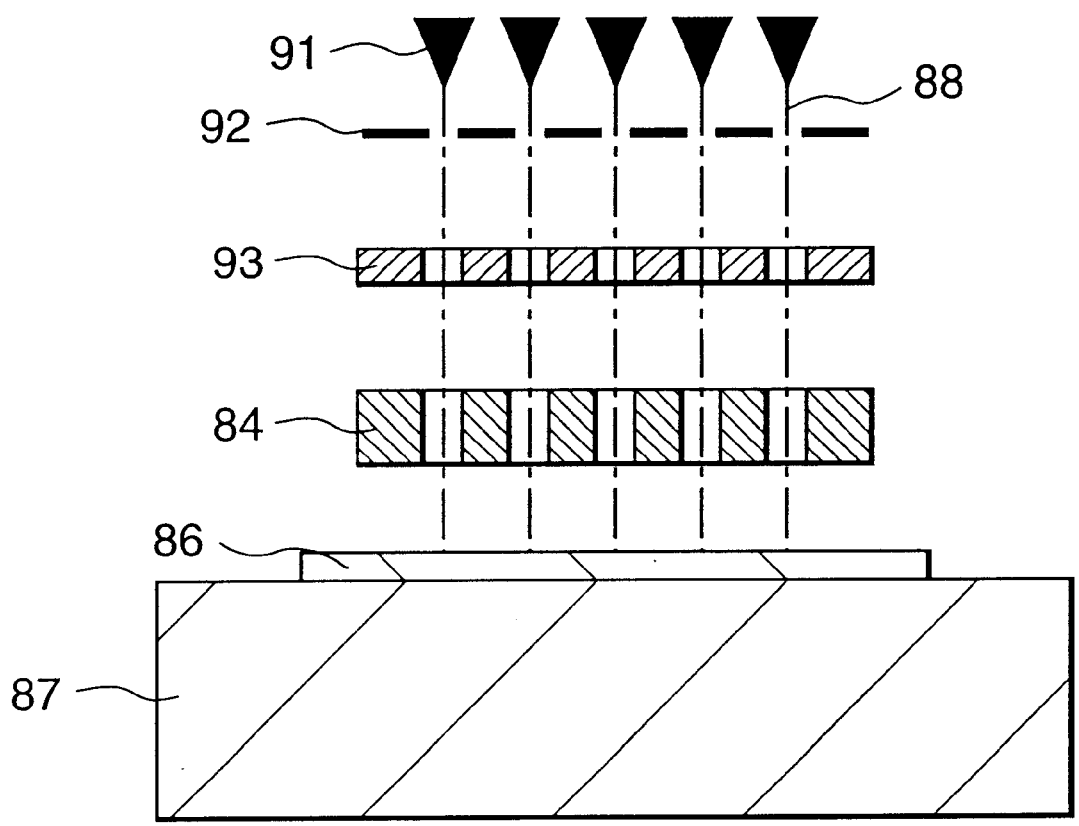
FIG. 9 is a sectional view showing an example of a multi-beam scheme using a plurality of electron sources as an application example of the multi-beam scheme.
Figure 10:
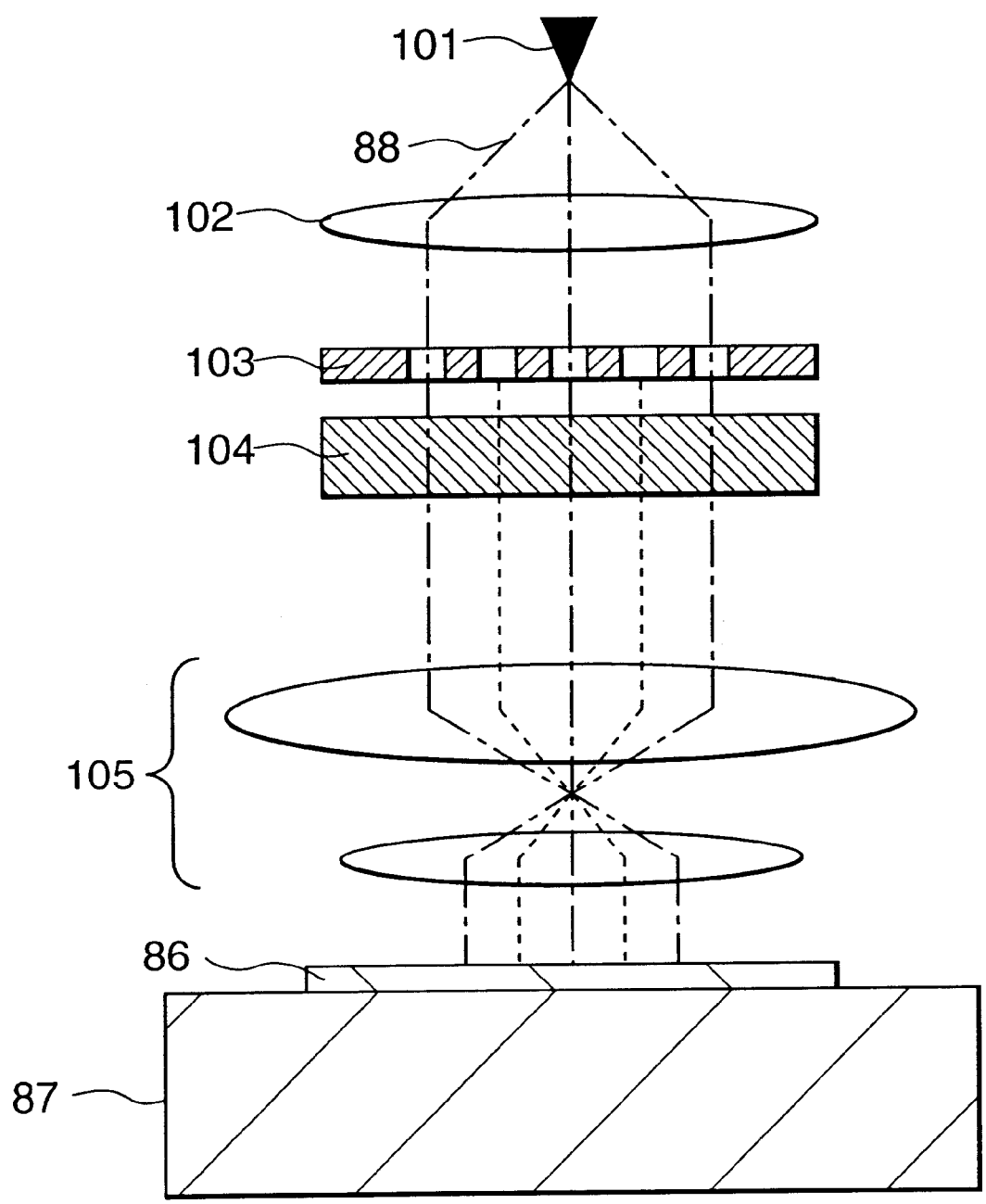
FIG. 10 is a sectional view showing an example of a correction optical system multi-beam scheme as an application example of the multi-beam scheme.

FIGS. 8 to 10 show some application examples of multi-beam lithography schemes. FIG. 8 shows an example of a multi-beam scheme using one electron source. In this example, an electron beam 88 emitted by a single electron source 81 is collimated by a condenser lens 82, and is then split into a plurality of beams by a multi-aperture & blanker 83. These beams are focused at a predetermined position on a wafer 86 using a multi-lens 84, and a stage 87 and deflector 85 are synchronously scanned, thus attaining direct write. Since the resistor electrode lenses of the present invention can be laid out at a high density per unit area, the multi-lens 84 to which these lenses are applied can generate electron beams with uniform characteristics on the basis of a beam with a relatively narrow radiation angle range emitted by an electron gun. Hence, uniformity of the irradiated beam can be improved, and the beam current density can be increased.

FIG. 9 shows an example of a multi-beam lithography scheme using multi electron sources. In this example, electron beams 88 emitted by electron sources 91 pass through a multi-aperture 92 and blanker 93, and are focused by a multi-lens 84 to strike a wafer 86. In this case, direct write is done by synchronizing scan of a stage 87 and the blanker 93. Since the degree of integration of the electron beams 88 in this scheme is determined not by the size of the multi electron sources 91 but by the size of each electrostatic lens, an electron beam lithography apparatus with high degree of beam integration and high productivity can be realized by applying the resistor electrode lens of the present invention to the multi-lens 84.

FIG. 10 shows an example of a multi-beam scheme using a correction optical system like that described in Japanese Patent Laid-Open No. 9-245708. In this example, an electron beam 88 emitted by a single electron source 101 is collimated by a condenser lens 102, and is split into a plurality of beams by an aperture & blanker 103. After that, the beams are reduced by a reduction electron optical system 105 via an aberration correction multi-lens 104 that corrects lens aberrations of the reduction lens 105, and strike a wafer 86. With this method, a plurality of intermediate images of the light source are formed in a direction perpendicular to the optical axis of the reduction electron optical system 105, and aberrations produced upon projecting these intermediate images onto the wafer 86 in a reduced scale via the reduction electron optical system 105, especially, field curvature and the like, can be corrected in advance. Hence, the direct write range can be broadened without decreasing the resolution of the electron optical system, and the productivity of the lithography apparatus can be improved. When the present invention is applied to such apparatus, more multi beams are formed within the effective direct write range to further improve the productivity.

Wiring of the wiring electrode of the high-resistance electrode lens applied to the multi-lens is formed in correspondence with the purpose of the multi-lens in each multi-beam scheme. For example, in the examples shown in FIGS. 8 and 9, it is preferable to allow independent control of lens power in combination with height correction such as the curvature or the like of the surface of the wafer 86. On the other hand, in the example shown in FIG. 10, it is preferable to have variable lens power at the center of the beam axis in consideration of correction of field curvature. Note that the wiring electrode 6 in FIG. 1 corresponds to a wiring example with variable lens power in a linear direction.

As other application examples of the present invention, the present invention is not limited to electron beam applied apparatuses such as an electron beam microscope, electron beam distance measurement apparatus, and the like, but may be applied to charged beam applied apparatuses of an ion beam and the like. In such applications, a size reduction and high processing speed of the apparatus can be achieved.

As described above, according to the resistor electrode lens of the present invention, a multi-lens which can prevent charge-up due to a scattered beam in the lens aperture, can improve lens focusing characteristics of the electrostatic lens, can prevent crosstalk due to electric fields of the multi-lens, and has a high degree of integration can be realized. Also, a compact charged beam applied apparatus with high productivity can be manufactured.

(Device Manufacturing Method)

An embodiment of a device manufacturing method using the aforementioned electron beam lithography apparatus or charged beam applied apparatus will be explained below.

Figure 11:
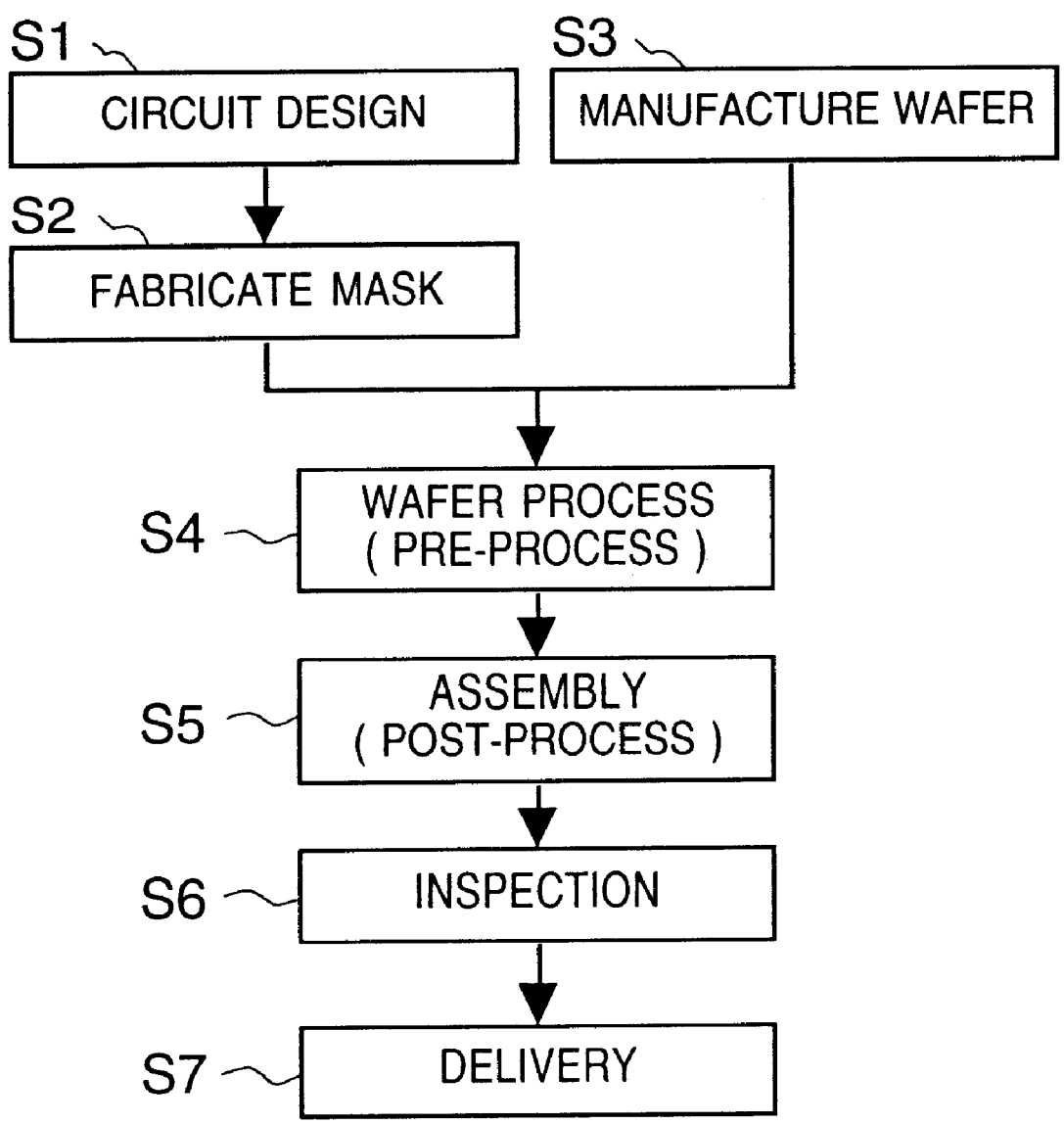
FIG. 11 is a flow chart showing the device manufacturing method that can use an electron beam exposure apparatus to which the present invention is applied.

FIG. 11 shows the flow in the manufacture of a microdevice (a semiconductor chip such as an IC, LSI, or the like, liquid crystal panel, CCD, thin film magnetic head, micromachine, or the like). In step 1 (circuit design), the circuit design of a semiconductor device is made. In step 2 (generate exposure control data), exposure control data of the exposure apparatus is generated based on the designed circuit pattern. In step 3 (fabricate wafer), a wafer is fabricated using materials such as silicon, and the like. Step 4 (wafer process) is called a pre-process, and an actual circuit is formed by lithography using the exposure apparatus input with the exposure control data and the wafer. The next step 5 (assembly) is called a post-process, in which semiconductor chips are assembled using the wafer obtained in step 4, and includes an assembly process (dicing, bonding), a packaging (encapsulating chips), and the like. In step 6

(inspection), inspections such as operation tests, durability tests, and the like of semiconductor devices assembled in step 5 are run. Semiconductor devices are completed via these processes, and are delivered (step 7).

Figure 12:
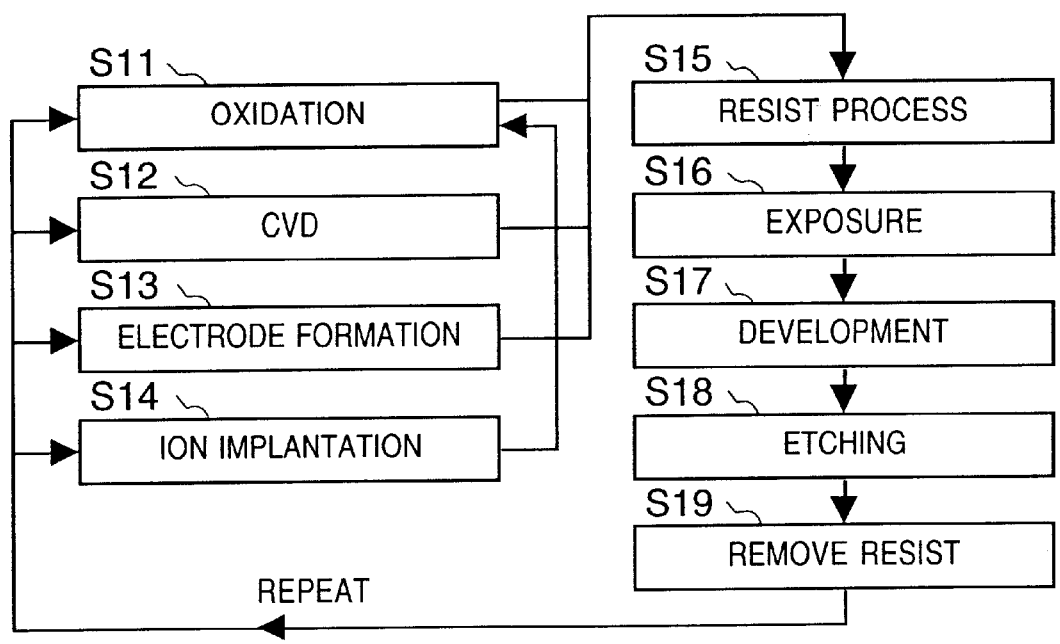
FIG. 12 is a flow chart showing details of a wafer process in FIG. 11.

FIG. 12 shows the detailed flow of the wafer process. In step 11 (oxidation), the surface of the wafer is oxidized. In step 12 (CVD), an insulating film is formed on the wafer surface. In step 13 (electrode formation), electrodes are formed by deposition on the wafer. In step 14 (ion implantation), ions are implanted into the wafer. In step 15 (resist process), a photosensitive agent is applied on the wafer. In step 16 (exposure), the circuit pattern is printed on the wafer by exposure using the aforementioned exposure apparatus. In step 17 (development), the exposed wafer is developed. In step 18 (etching), a portion other than the developed resist image is removed by etching. In step 19 (remove resist), the resist film which has become unnecessary after etching is removed. By repeating these steps, multiple circuit patterns are formed on the wafer.

Using the manufacturing method of this embodiment, a semiconductor device with a high degree of integration, which is hard to manufacture in the prior art, can be manufactured with low cost.

As described above, according to the present invention, charge-up caused by a scattered beam in the lens aperture can be prevented by a simple arrangement, and crosstalk between electrostatic lenses can be suppressed. Hence, a multi-lens type electrostatic lens which assures a stable beam position and lens characteristics, and has a high degree of integration can be provided. By changing the resistance of a high-resistance portion, the electric field distribution in the electrostatic lens can be adjusted, and the aberration characteristics of the electrostatic lens can be improved. Furthermore, since the electrode structure is simple, the manufacturing step can be simplified, and a multi-lens with low mechanical required precision can be manufactured. Also, since a multi-lens can be prepared by laying out electrostatic lenses at high density, an electron beam lithography apparatus and charged beam applied apparatus with high productivity can be realized. Hence, the productivity in the manufacture of devices using these apparatuses can be improved.

As many apparently widely different embodiments of the present invention can be made without departing from the spirit and scope thereof, it is to be understood that the invention is not limited to the specific embodiments thereof except as defined in the appended claims.

What is claimed is:

1. A multi-lens comprising:
    a substrate which is formed by stacking high-resistance substrates each having a plurality of lens apertures, an inner wall of which is formed by a resistance portion along a beam axis of a beam emitted by a beam source, and which has an electrode bonded around the plurality of lens apertures between the high-resistance substrates; and
    electrode substrates having apertures corresponding to the plurality of lens apertures, wherein the electrode substrates are bonded to two surfaces of said substrate,
    wherein a resistance of at least one of said electrode substrates is lower than a resistance of said resistance portion.

2. The lens according to claim 1, wherein the resistance portion is made up of high-resistance layers formed on inner walls of apertures formed in insulating substrates,
    said electrode substrates are formed by forming apertures corresponding to the lens apertures in a low-resistance substrate, and
    a wiring for the electrode is formed via the insulating substrates stacked on the two sides of the electrode.

3. The lens according to claim 1, wherein the plurality of lens apertures are independently controlled.

4. The lens according to claim 1, wherein the plurality of lens apertures are laid out to form a face-centered structure.

5. The lens according to claim 2, wherein the low-resistance substrate is located on an outermost side to sandwich the insulating substrates, and a thickness T thereof and a diameter D of the aperture satisfy T>0.3D.

6. The lens according to claim 1, wherein the resistance of the resistance portion is not constant along a beam axis direction.

7. The lens according to claim 1, wherein the resistance of the resistance portion has a positive differential coefficient along the beam axis.

8. The lens according to claim 1, wherein a plurality of electrodes are present in a beam axis direction, and arbitrary potentials can be respectively applied to the plurality of electrodes.

9. The lens according to claim 8, wherein a differential coefficient of a gradient of a voltage applied to the plurality of electrodes present in the beam axis direction is positive in an acceleration lens system and is negative in a deceleration lens system along the beam axis.

10. The lens according to claim 1, further comprising temperature-controllable cooling means.

11. The lens according to claim 1, wherein a resistivity of the resistance portion falls within a range from $10^6$ Ωcm to $10^9$ Ωcm.

12. The lens according to claim 1, wherein the resistance portion consists of any one of silicon carbide, a nitrogen compound, and cladglass.

13. An electron beam lithography apparatus for directly writing a pattern on a substrate with an electron beam, comprising:
    a substrate which is formed by stacking high-resistance substrates each having a plurality of lens apertures, an inner wall of which is formed by a resistance portion along a beam axis of a beam emitted by an electron beam source, and which has an electrode bonded around the plurality of lens apertures between the high-resistance substrates; and
    electrode substrates having apertures corresponding to the plurality of lens apertures, wherein the electrode substrates are bonded to two surfaces of said, and
    wherein a resistance of at least one of said electrode substrates is lower than a resistance of said resistance portion.

14. A charged beam applied apparatus for processing using a charged beam, comprising:
    a substrate which is formed by stacking high-resistance substrates each having a plurality of lens apertures, an inner wall of which is formed by a resistance portion along a beam axis of a beam emitted by a charged beam source, and which has an electrode bonded around the plurality of lens apertures between the high-resistance substrates; and
    electrode substrates having apertures corresponding to the plurality of lens apertures, wherein the electrode substrates are bonded to two surfaces of said substrate, and
    wherein a resistance of at least one of said electrode substrates is lower than a resistance of said resistance portion.

15. A method of manufacturing a device, comprising:
    a step of applying a resist on a substrate;

a step of directly writing a pattern on the substrate using an electron beam lithography apparatus; and a development step of developing the substrate, said electron beam lithography apparatus comprising:

a substrate which is formed by stacking high-resistance substrates each having a plurality of lens apertures, an inner wall of which is formed by a resistance portion along a beam axis of a beam emitted by an electron beam source, and which has an electrode bonded around the plurality of lens apertures between the high-resistance substrates; and electrode substrates having apertures corresponding to the plurality of lens apertures, wherein the electrode substrates are bonded to two surfaces of said substrate, and wherein a resistance of at least one of said electrode substrates is lower than a resistance of said first resistance portion.

16. A method of manufacturing a device, comprising:

a step of applying a resist on a substrate;

a step of directly writing a pattern on the substrate using a charged beam applied apparatus; and a development step of developing the substrate, said charged beam applied apparatus comprising:

a substrate which is formed by stacking high-resistance substrates each having a plurality of lens apertures, an inner wall of each of which is formed by a resistance portion along a beam axis of a beam emitted by an electron beam source, and which has an electrode bonded around the plurality of lens apertures between the high-resistance substrates; and electrode substrates having apertures corresponding to the plurality of lens apertures, wherein the electrode substrates are bonded to two surfaces of said substrate, wherein a resistance of at least one of said electrode substrates is lower than a resistance of said first resistance portion.

17. An electrostatic lens comprising:

a substrate which is formed by stacking high-resistance substrates each having a lens aperture, an inner wall of which is formed by a resistance portion along a beam axis of a beam emitted by a beam source, and which has an electrode bonded around the lens aperture between the high-resistance substrates; and electrode substrates having an aperture corresponding to the lens aperture, wherein the electrode substrates are bonded to two surfaces of said substrate, and wherein a resistance of at least one of said electrode substrates is lower than a resistance of said resistance portion.

18. A multi-lens comprising:

a plurality of electrode substrates, each of which is formed with a plurality of apertures; and substrates having apertures corresponding to the plurality of lens apertures, wherein the substrates are sandwiched by the plurality of electrode substrates, wherein the substrates have a relieve function of relieving a charge loaded to the substrates by striking an electron or charged particle to a side wall of the plurality of lens apertures.

* * * * *

UNITED STATES PATENT AND TRADEMARK OFFICE
CERTIFICATE OF CORRECTION

PATENT NO. : 6,617,595 B1
DATED : September 9, 2003
INVENTOR(S) : Masahiko Okunuki It is certified that error appears in the above-identified patent and that said Letters Patent is hereby corrected as shown below:

<u>Title page,</u>
Item [*] Notice, "0 days" should read -- 61 days --.

<u>Column 6,</u>
Line 12, "the" should read -- wherein the --; and
Line 66, "resistance." should read -- resistance --.

<u>Column 10,</u>
Line 46, "said," should read -- said substrate --.

Signed and Sealed this

Twenty-seventh Day of April, 2004

JON W. DUDAS
*Acting Director of the United States Patent and Trademark Office*